US010539236B2

(12) United States Patent
Aromin et al.

(10) Patent No.: US 10,539,236 B2
(45) Date of Patent: *Jan. 21, 2020

(54) GASKET RETAINER FOR MATING AN ELECTRICAL DEVICE ENCLOSURE

(71) Applicant: Tower Manufacturing Corporation, Providence, RI (US)

(72) Inventors: Victor V Aromin, West Warwick, RI (US); Daniel R Paquette, Woonsocket, RI (US); Louis Jay Shatkin, Warwick, RI (US)

(73) Assignee: Tower Manufacturing Corporation, Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/147,924

(22) Filed: Oct. 1, 2018

(65) Prior Publication Data

US 2019/0032782 A1 Jan. 31, 2019

Related U.S. Application Data

(63) Continuation-in-part of application No. 15/459,487, filed on Mar. 15, 2017, now Pat. No. 10,132,410.

(51) Int. Cl.
*F16J 15/04* (2006.01)
*F16J 15/06* (2006.01)

(52) U.S. Cl.
CPC .............. *F16J 15/04* (2013.01); *F16J 15/062* (2013.01)

(58) Field of Classification Search
CPC .............. F16J 15/00; F16J 15/12; F16J 15/14
See application file for complete search history.

(56) References Cited

U.S. PATENT DOCUMENTS

| 4,112,283 A * | 9/1978 | Lathrop | .................... F02P 7/04 |
| | | | 116/200 |
| 4,298,204 A * | 11/1981 | Jinkins | .................... F16J 15/062 |
| | | | 220/378 |
| 5,957,464 A * | 9/1999 | Elliott | .................... F16J 15/062 |
| | | | 277/608 |
| 8,531,834 B2 * | 9/2013 | Rayner | .................. H01H 13/06 |
| | | | 361/679.56 |

(Continued)

*Primary Examiner* — Gilbert Y Lee (57) ABSTRACT

A sealing assembly for mating two sections of an electrical device enclosure is disclosed. The enclosure includes a top and bottom joinable section. The sealing assembly includes a first sealing section disposed on the top joinable section that has both first and second upper projecting lip extensions. The second upper projecting lip extension has a height less than the first upper projecting lip extension and forms a channel therebetween. A second sealing section is disposed on the bottom joinable section, and includes a downward projecting lip extension and channel. The downward projecting lip extension is offset from the first section first upward projecting lip extension when the top and bottom joinable sections are joined. At that point the downward projecting lip extension engages within the channel of the first sealing section, and the second upper projecting lip extension of said first sealing section is engaged within the second sealing section channel. The second sealing section channel includes a compressible stubbed gasket having at least one locating stub corresponding to a receptacle in the top joinable section for positioning and holding the gasket within the top section during assembly.

15 Claims, 11 Drawing Sheets

(56) References Cited

U.S. PATENT DOCUMENTS

| | | | | |
|---|---|---|---|---|
| 9,248,944 B2* | 2/2016 | Miyagawa | ............. | F16J 15/024 |
| 2013/0292383 A1* | 11/2013 | Mullaney | ............... | B65D 53/06 |
| | | | | 220/378 |

* cited by examiner

GASKET RETAINER FOR MATING AN ELECTRICAL DEVICE ENCLOSURE

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. patent application Ser. No. 15/459,487, entitled "Sealing Assembly For Mating an Electrical Device Enclosure", naming Victor V. Aromin as inventor, filed 15 Mar. 2017.

FIELD OF THE INVENTION

This invention relates to waterproof sealing of enclosures for electrical devices. The present invention relates to a gasket with integral stub retainers. More particularly, the present invention relates to a gasket including a plurality of locating and retaining stubs formed on peripheral edges of the gasket to locate and retain the gasket on a mating surface of a mating component.

BACKGROUND

Electrical equipment such as transformers, relays, GFCIs, etc. which may be used outdoors, or may be used in an environment that has a risk of water contact, must be protected. This is not only to prevent the electrical equipment from electrically shorting, for example when it rains, but also to increase their useful life which would otherwise by shortened by constant exposure to the elements, ultraviolet and solar radiation, and so forth. Accordingly, there have long been protective enclosures in which this type of equipment has been housed. And, the enclosures must be accessed for service, repair, or replacement of the equipment.

It is well known that when connecting housing components of electronic or electrical devices together, gaskets must be used to ensure a secure and tight seal, to form a proper watertight connection. Furthermore gaskets have a tendency to twist or dislocate during assembly of the electrical housing thereby preventing a watertight seal. Therefore, there is a need for a locating and holding means to retain the shape of gaskets and to aid in keeping them flush against connector bodies during compression.

Known devices for keeping gaskets in position during compression, such as in the coupling of conduits, or the like, usually include some type of compression fitting that forces the gasket inwardly as the conduits are being secured together. Such compression fittings usually include threaded portions and/or tapered portions on the inside of the conduits that force or urge the gasket against an inside diameter or wall when the conduits are screwed or otherwise secured together.

The known compression fittings are useful in many situations; however, they do not act to properly hold round or semi-circular gaskets in a position flush against a connector body when securing components together in electrical devices, wherein the sealing effectiveness may be compromised if the gaskets bow or are otherwise pushed outwardly, away from the connector body.

Furthermore, known compression fittings use compressive forces that can over-stress or wear-out gaskets. Therefore, there exists a need in the art for a holding or retaining device that is easy to use and which more accurately and securely holds or retains in place a sealing gasket used when sealing components of electrical devices, without unduly stressing or compressing such gaskets.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1:
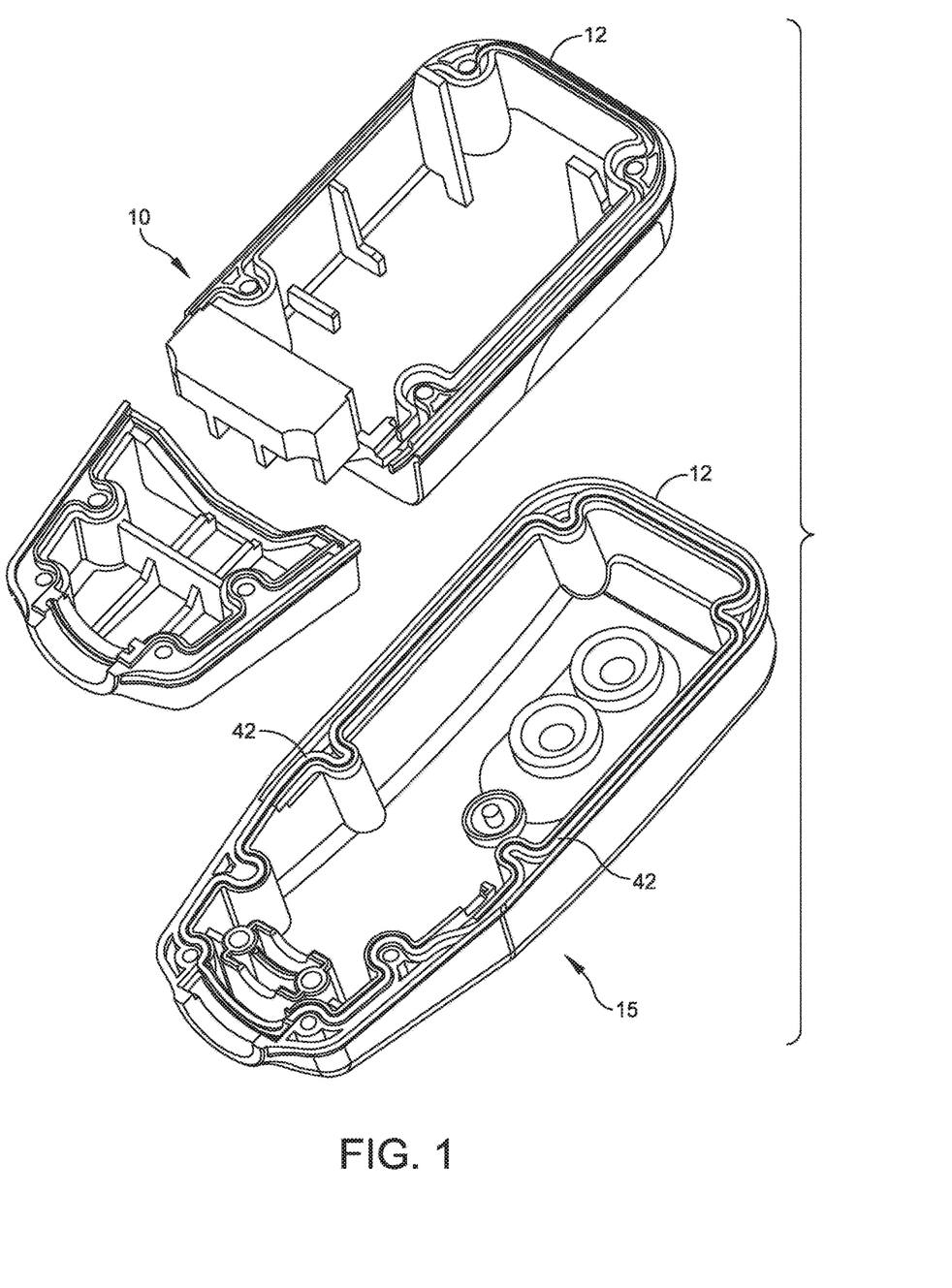
FIG. 1 is a perspective view of a sealing gasket arrangement for a GFCI enclosure.
Figure 2:
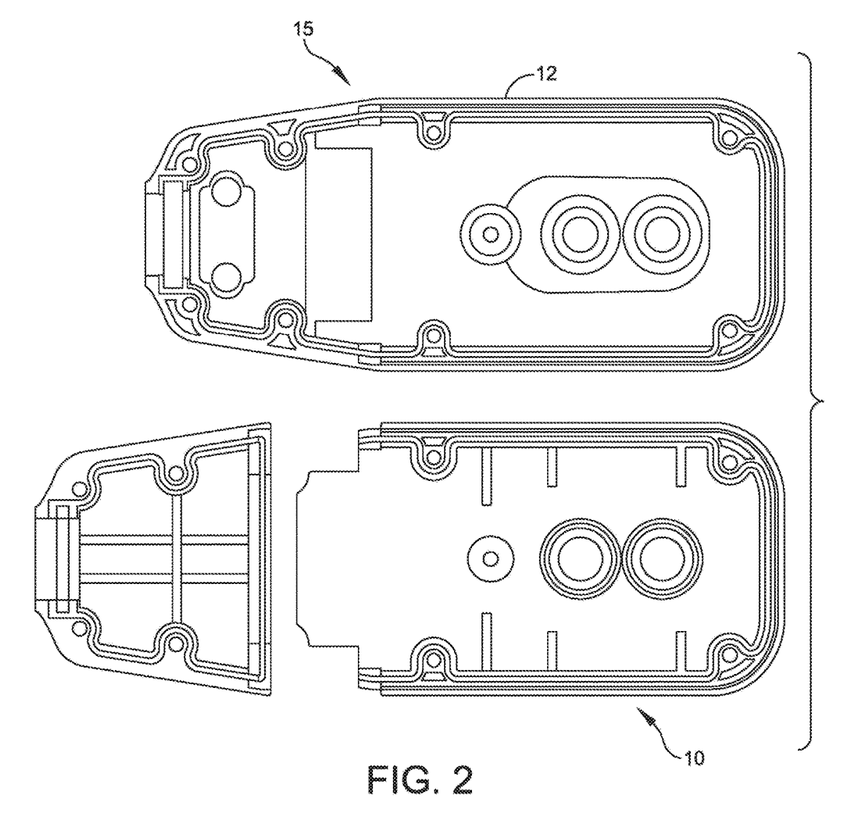
FIG. 2 is top view of FIG. 1.
Figure 3:
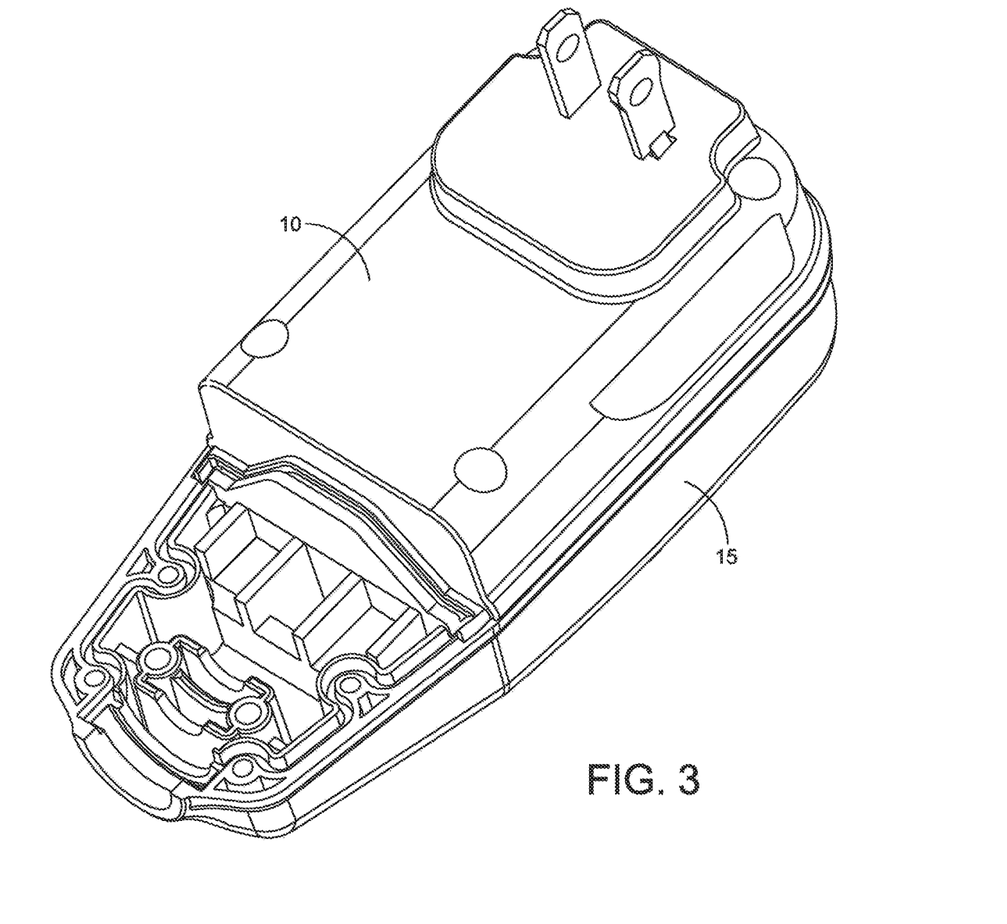
FIG. 3 is a perspective view of the sealing gasket arrangement for a GFCI enclosure partially assembled.

Referring to FIG. 1, is illustrated a sealing assembly implemented in an enclosure for a Ground Fault Circuit Interrupter (GFCI). However, the sealing assembly of the present invention can be applied to any structure suitable for housing an electrical device, or structure for sealing against moisture and the elements. Although, in the preferred embodiment illustrated herein, the sealing assembly, or arrangement is illustrated as implemented along the periphery of the enclosure sections, the assembly may be implemented in any arrangement/position to facilitate the mating of two sections.

Figure 4:
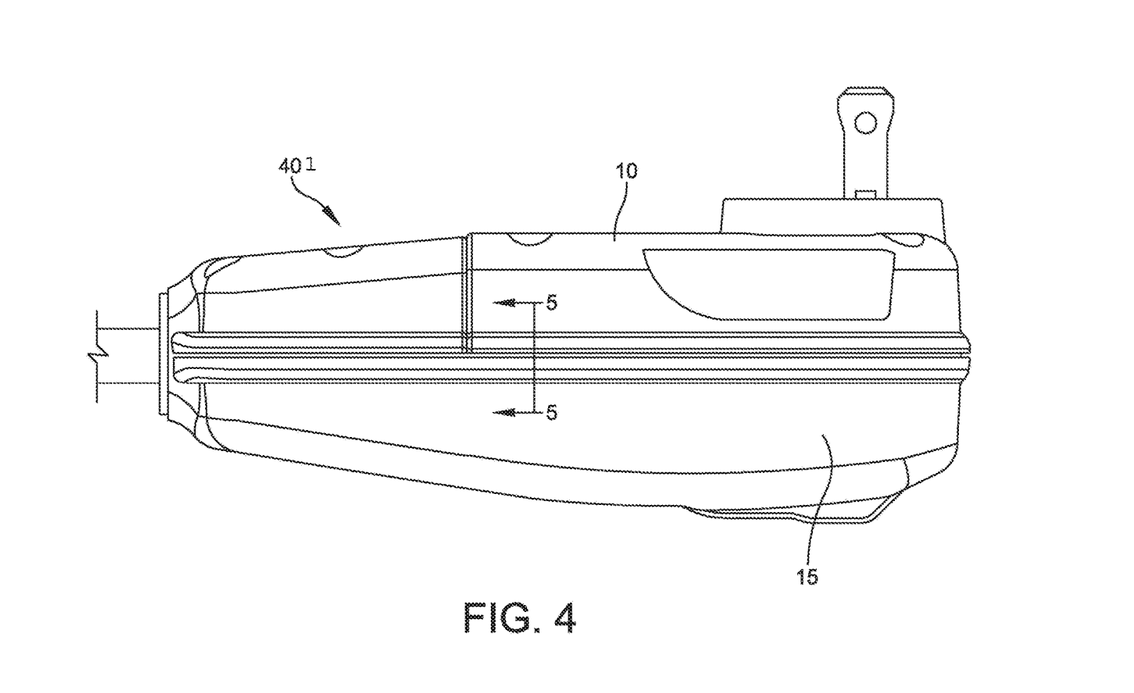
FIG. 4 is a side view of the assembled GFCI enclosure of FIG. 1.
Figure 5:
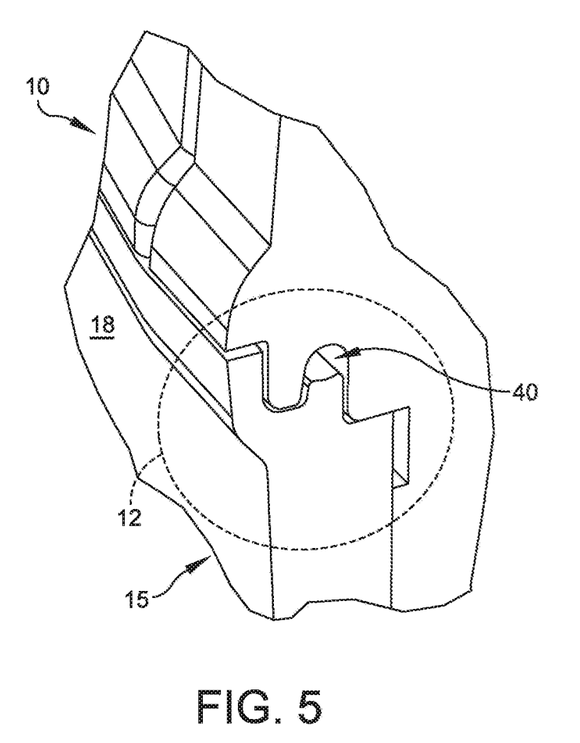
FIG. 5 is a cross sectional view of the sealing assembly of the present invention as implemented in the GFCI enclosure of FIG. 1.
Figure 6:
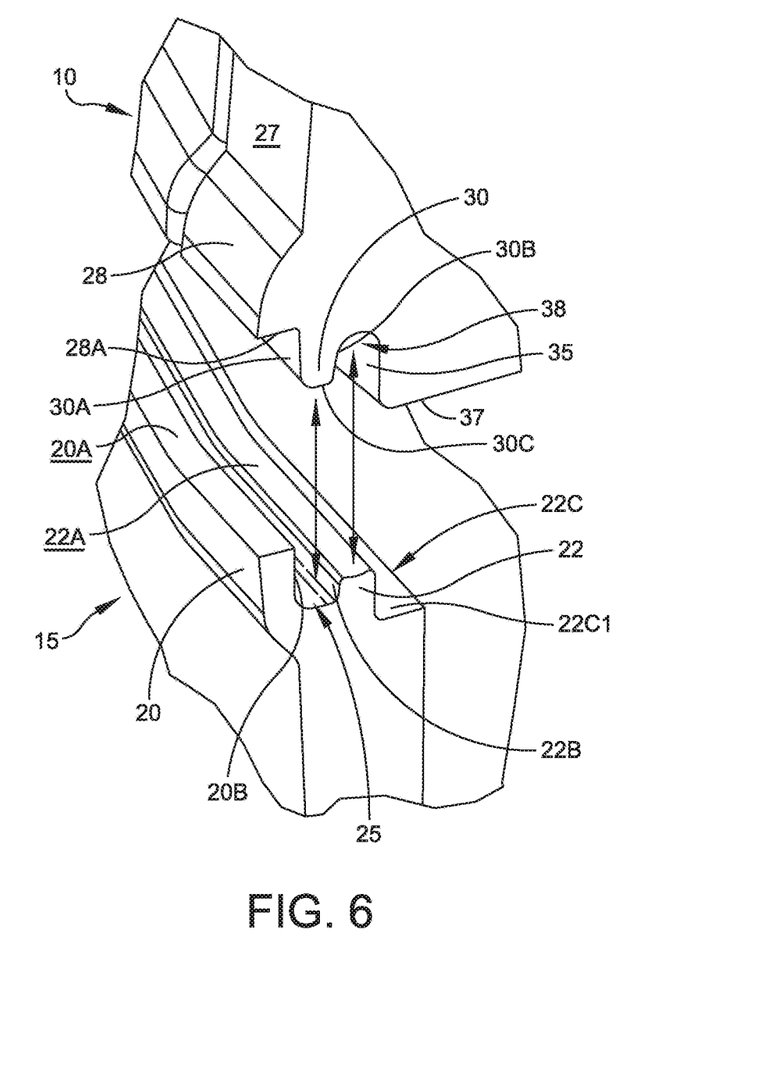
FIG. 6 is an exploded view of FIG. 5.

Sealing assembly 12 is integrated in the periphery of both the top cover 15 and bottom cover 10 of the GFCI enclosure 401 of FIG. 4. Referring to FIGS. 1, 5 and 6, the sealing mechanism 12 in this example is for mating the top 15 and bottom 10 covers of an electrical enclosure, the electrical enclosure illustrated as being GFCI enclosure 401.

Referring to FIGS. 5 and 6, top cover 15 includes a sidewall 18 having a first upper projecting lip 20 including a top surface 20A and interior side surface 20B. A second upper lip projection 22 formed interior to sidewall 18 includes a top surface 22A and side surfaces 22B and 22C. First upper projecting lip 20 top surface 20A extends higher than second upper lip projection 22 top surface 22A. First upper projecting lip 20 interior side surface 20B opposes second upper lip projection 22 first side surface 22B forming a channel 25 therebetween. Second side surface 22C of second upper lip projection 22 extends downward to a orthogonal base 22C1 that sits lower than the base of channel 25.

Referring to FIG. 6, bottom cover 10 includes a sidewall 27 having a first downward projecting lip 28. The downward projecting lip 28 includes a bottom surface 28A that projects inward from sidewall 27 to a first downward lip extension 30 to form an edge recess. Downward lip extension 30 includes opposing side surfaces 30A and 30B and a top surface 30C. The edge recess is formed by bottom surface 28A and side surface 30A. Side surface 30B is opposite a third opposing side surface 35 extending to an orthogonal extension surface 37, which forms a downward projecting lip. Side surface 30B and opposing side surface 35 form a channel 38 therein. Orthogonal extension surface 37, forming a downward projecting lip extends beyond top surface 30C, of downward lip extension 30, which extends beyond bottom surface 28A.

As illustrated in FIGS. 5 and 6, when top 15 and bottom covers 10 are mated lip extension 20 top surface 20A is in substantial alignment with bottom surface 28A, and downward lip extension 30 is received in channel 25. Also, channel 38 receives upper lip projection 22, and orthogonal lip extension surface 37 of bottom cover 10 is in substantial alignment with orthogonal base 22C1 of top cover 15. Upper lip extension 22 rests below the top surface of channel 38 to leave an opening 40 for the placement of a sealing gasket 42 therein (See FIG. 7). Top surface 22A of upper lip projection 22 may include a curved seating surface to seat sealing gasket 42. Furthermore, channel 38 may include a rounded top surface for better sealing and compression of a gasket 42 located within opening 40.

Figure 7:
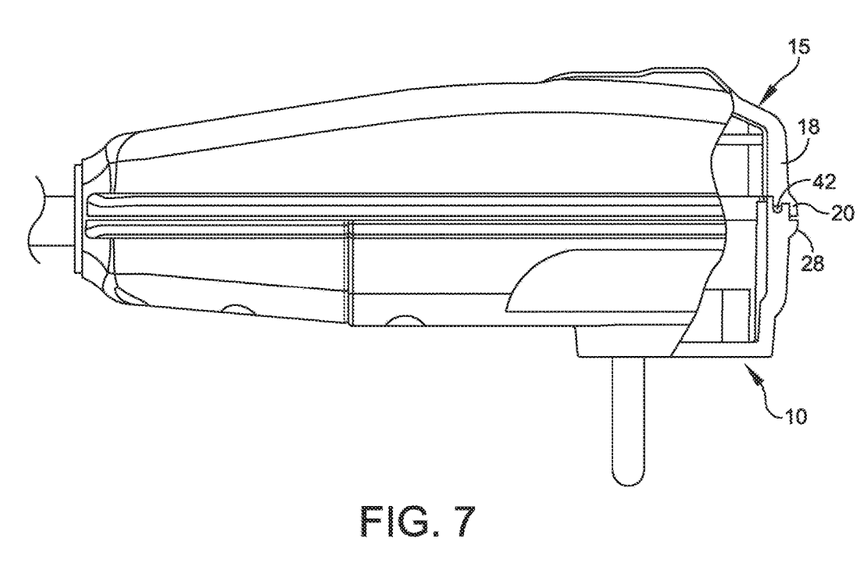
FIG. 7 is a partial cross-sectional view of the sealing assembly of FIG. 4.

Referring to FIGS. 5 and 7, the mated enclosure includes a compressible gasket 42 (See FIG. 1/FIG. 7) in opening 40 that is sized appropriately to compress within the opening 40. The gasket is utilized for the prevention of moisture and seepage within the enclosure. The sealing arrangement provides a path for seepage/moisture even before the seepage/moisture reaches the interior of the sealing assembly at the gasket point. The compressible gasket can be made from molded silicone or similar materials that are less degradable over time. By not exposing the gasket 42, UL regulations allow for more choices for gasket materials.

Figure 8:
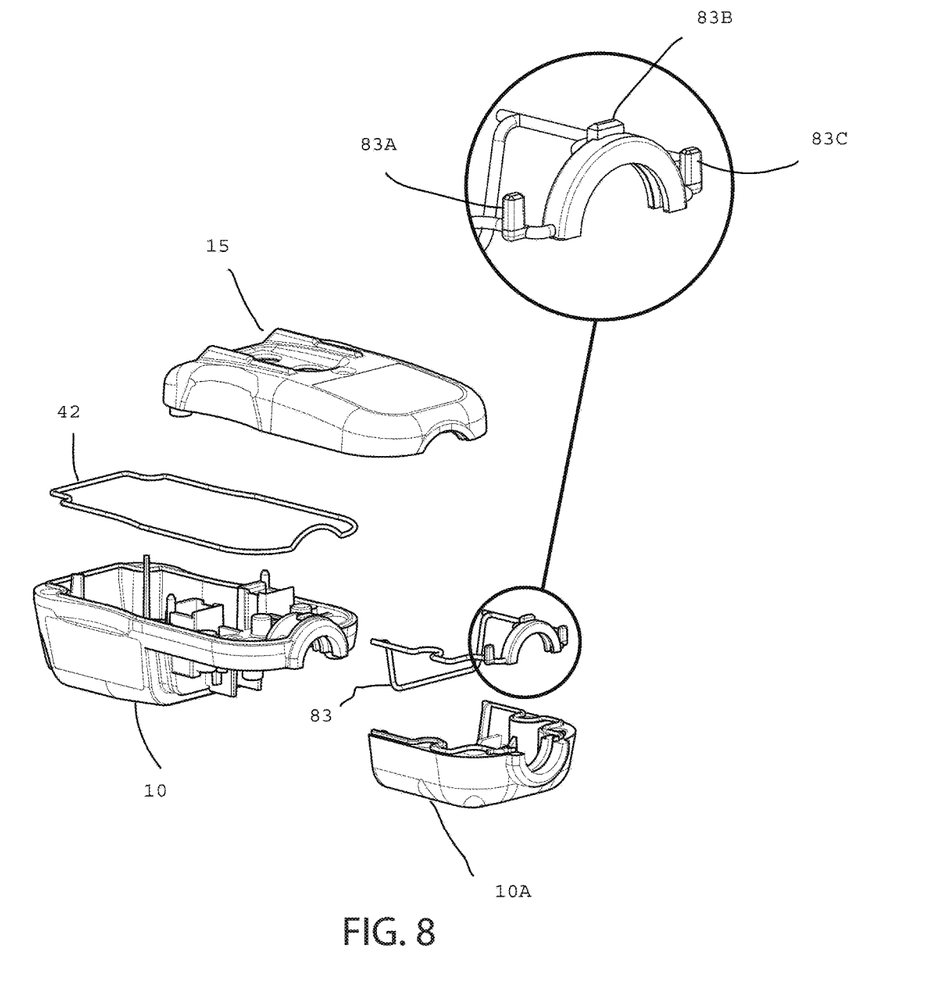
FIG. 8 is a perspective view of a multi stubbed sealing gasket arrangement for a GFCI enclosure partially disassembled.
Figure 9:
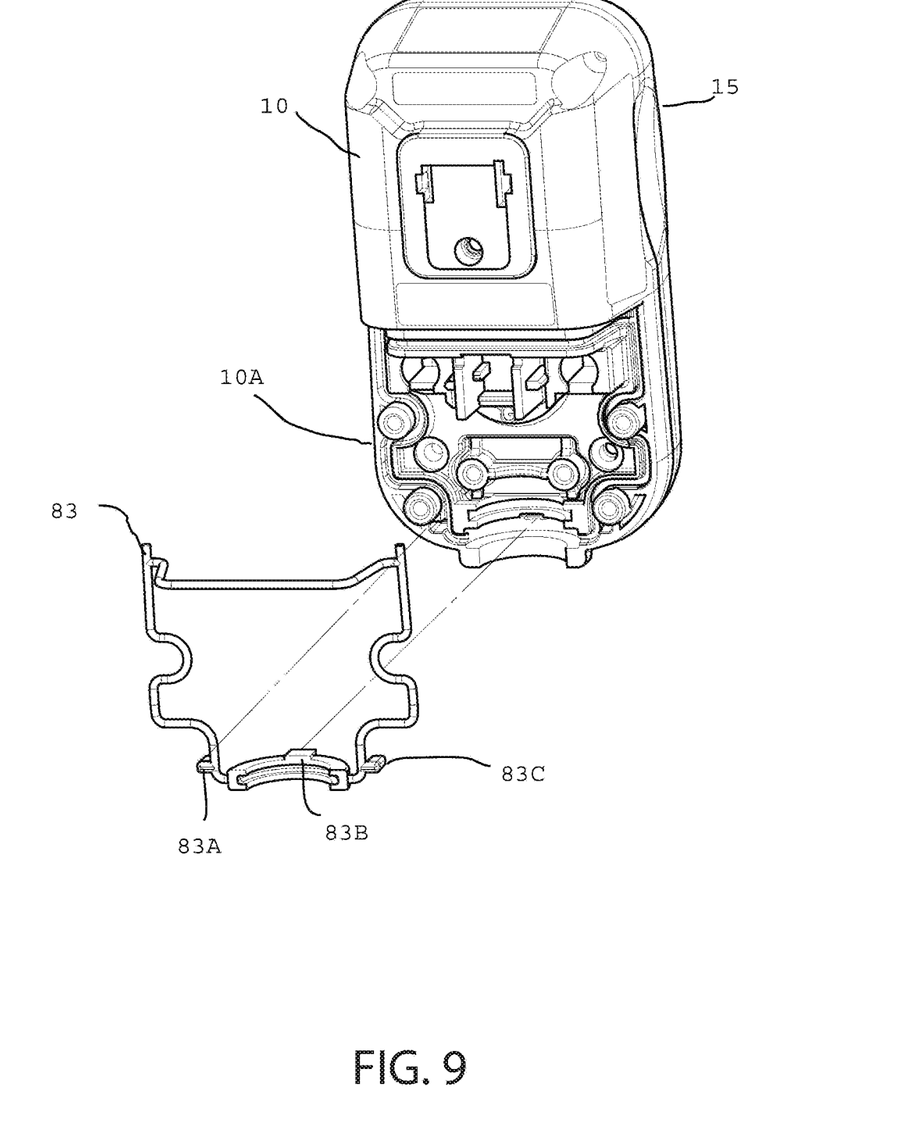
FIG. 9 is a perspective view of the multi stubbed sealing gasket arrangement for a GFCI enclosure partially assembled.

Referring also to FIGS. 8 and 9 there are shown a perspective view of a multi stubbed sealing gasket arrangement for a GFCI enclosure partially disassembled; and a perspective view of the multi stubbed sealing gasket arrangement for a GFCI enclosure partially assembled. Shown in FIG. 8 is stubbed gasket 83 with locating stubs 83A, 83B, and 83C. FIG. 9 shows corresponding stub receiver slots 93A, 93B, and 93C. It will be appreciated that gasket stubs 83A, 83B, and 83C fitted into corresponding stub receiver slots 93A, 93B, and 93C help to properly locate and hold gasket 83 during mating assembly of cover 10A onto cover 10 (shown in FIG. 8).

Figure 10:
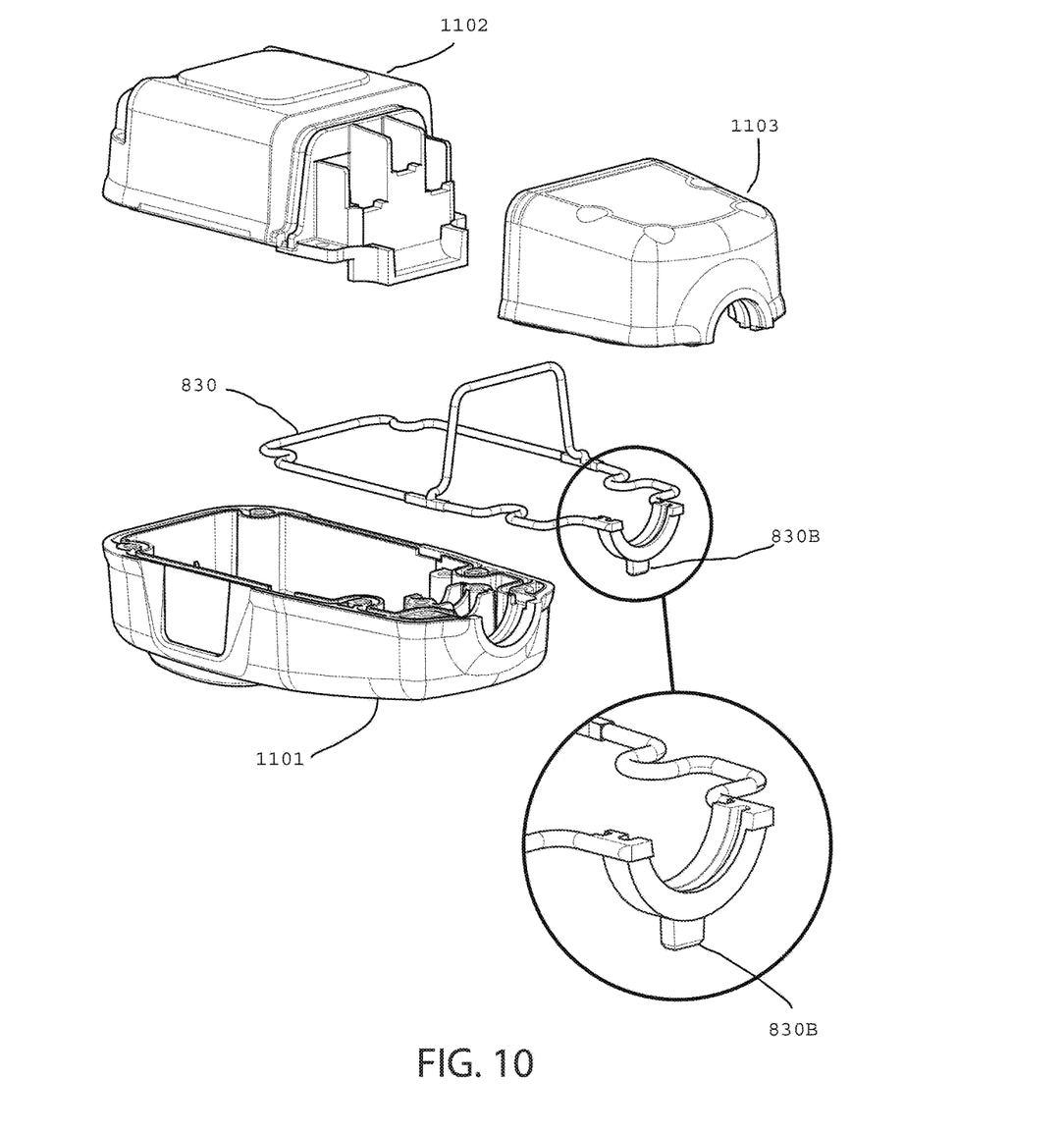
FIG. 10 is a perspective view of a single stubbed sealing gasket arrangement for a GFCI enclosure partially disassembled.
Figure 11:
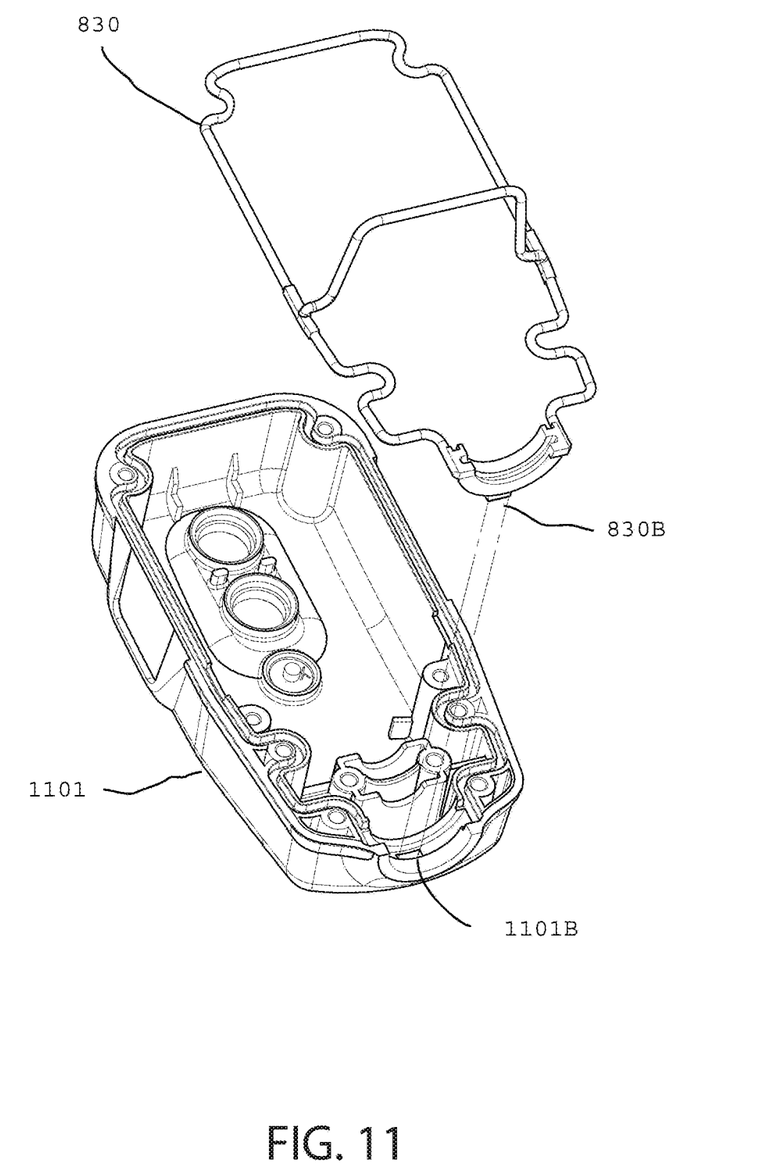
FIG. 11 is a perspective view of a single stubbed sealing gasket arrangement for a GFCI enclosure partially disassembled.

Referring also to FIGS. 10 and 11 there are shown a partial perspective view of a single stubbed sealing gasket arrangement for a GFCI enclosure 110 partially disassembled; and a perspective view of the single stubbed sealing gasket arrangement for a GFCI enclosure partially assembled. Shown in FIG. 10 is stubbed gasket 830 with locating stub 830B. FIG. 11 shows corresponding stub receiver or receptacle slot 1101B. It will be appreciated that gasket stub 830B fitted into corresponding stub receiver slot 1101B helps to properly locate and hold gasket 830 during mating assembly of housings 1101, 1102, and 1103.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

We claim:

1. A sealing gasket assembly for mating an electrical device enclosure, the enclosure having top and bottom joinable sections, the sealing gasket assembly comprising:
   a first sealing section disposed on said top joinable section, said first sealing section including first and second upper projecting, lip extensions, the second upper projecting lip extension having a height less than the first upper projecting lip extension, the first and second upper projecting lip extensions of said first sealing section forming a channel therebetween;
   a second sealing section disposed on said bottom joinable section, said second sealing section comprising a downward projecting lip extension, said downward projecting lip extension offset from said first section upward projecting lip extension when said top and bottom joinable sections are joined, said downward projecting lip extension engaged within said channel of said first sealing section, said second sealing section further including a channel adjacent to said first downward projecting lip extension, said second upper projecting lip extension of said first sealing section engaged within said second sealing section channel;
   a stubbed gasket, wherein the gasket comprises at least one locating stub; and
   wherein the top joinable section comprises at least one receptacle for receiving the at least one locating stub.

2. The sealing gasket assembly for mating an electrical device enclosure, as in claim 1, wherein said second upper projecting lip extension of said first sealing section is partially engaged in said second sealing section channel, defining an opening therein.

3. The gasket sealing assembly for mating an electrical device enclosure, as in claim 2, wherein said opening in said second sealing section channel further includes the stubbed gasket therein.

4. The gasket sealing assembly for mating an electrical device enclosure, as in claim 3, wherein said first sealing section second upper projecting lip top surface further includes a curved seating surface, said stubbed gasket positioned on said seating surface.

5. The gasket sealing assembly for mating an electrical device enclosure, as in claim 3, wherein said stubbed gasket is sized to compress when said top and bottom joinable sections are joined.

6. The sealing gasket assembly for mating an electrical device enclosure, as in, claim 1, wherein said second sealing section downward projecting lip extension further includes first and second side surfaces, and wherein said second sealing section further includes a recessed edge having a bottom surface orthogonal to said downward projecting lip extension first side surface, and wherein said first sealing section first upper projecting lip extension further includes a top surface and a side surface, said first sealing section first upper projecting lip extension top surface in engagement with said bottom surface of said second sealing section recessed edge, and wherein said first sealing section first upper projecting lip side surface engages said second sealing section downward projecting lip first side surface, when said top and bottom joinable sections are joined.

7. The sealing gasket assembly for mating an electrical device enclosure, as in claim 1, wherein said first sealing section second upper projecting lip extension includes first and second side surfaces and a top surface, said second side surface extending below said first side surface to an orthogonal edge surface, said first sealing section second upper projecting lip extension extending partially into said second sealing section channel, defining an opening therein.

8. The sealing gasket assembly for mating an electrical device enclosure, as in claim 7, wherein said second sealing section channel includes first and second side surfaces and a top surface, said second side surface extending to an orthogonal edge surface.

9. The sealing gasket assembly for mating an electrical device enclosure, as in, claim 8, wherein said second upper projecting lip orthogonal edge surface and said second sealing section channel orthogonal edge surface are engaged when said top and bottom joinable sections are joined.

10. A sealing assembly for mating an electrical device enclosure, the enclosure having top and bottom joinable sections, the assembly comprising:
a first sealing section disposed on said top joinable section, said first sealing section including first and second upper projecting lip extensions, the second upper projecting lip extension having a height less than the first upper projecting lip extension, the first and second upper projecting lip extensions of said first sealing section forming a channel therebetween, wherein said first sealing section second upper projecting lip extension includes first and second side surfaces and a top surface, said second side surface extending below said first side surface to an orthogonal edge surface;
a second sealing section disposed on said bottom joinable section, said second sealing section comprising
a downward projecting lip extension, said downward projecting lip extension engaged within said channel of said first sealing section, and offset from said first section upward projecting lip extension when said top and bottom joinable sections are joined, wherein said downward projecting lip extension further includes first and second side surfaces, and wherein said second sealing section further includes a recessed edge having a bottom surface orthogonal to said downward projecting lip extension first side surface, and wherein said first sealing section first upper projecting lip extension further includes a top surface and a side surface, said first sealing section first upper projecting lip extension top surface in engagement with said bottom surface of said second sealing section recessed edge, and wherein said first sealing section first upper projecting lip side surface engages said second sealing section downward projecting lip first side surface, when said top and bottom joinable sections are joined,
said second sealing section further including a channel adjacent to said first downward projecting lip extension, and wherein said second sealing section channel further includes first and second side surfaces and a top surface, said second side surface extending to an orthogonal edge surface, and wherein said second upper projecting lip orthogonal edge surface and said second sealing section channel orthogonal edge surface are engaged when said top and bottom joinable sections are joined,
and wherein said first sealing section second upper projecting lip extension extends partially into said second sealing section channel, forming an opening therein, when said top and bottom joinable sections are joined, wherein said opening in said second sealing section channel further includes a stubbed gasket therein, wherein the stubbed gasket comprises a plurality of locating stubs, and wherein the top joinable section comprises a plurality of receptacle slots for receiving the plurality of locating stubs.

11. The sealing assembly for mating an electrical device enclosure, as in claim 10, wherein said stubbed gasket is sized to compress when said top and bottom joinable sections are joined.

12. A sealing assembly for mating an electrical device enclosure, the enclosure having top and bottom joinable sections, the assembly comprising:
a stubbed gasket, wherein the stubbed gasket comprises a plurality of locating stubs;
said top joinable section comprising a plurality of receptacles for receiving the plurality of locating stubs;
a first sealing section disposed on said top joinable section, said first sealing section including a plurality of upper projecting lips, said upper projecting lips decreasing in height;
a second sealing section disposed on said bottom joinable section, said second sealing section including a plurality of downward projecting lips, said downward projecting lips increasing in height, wherein said second sealing section plurality of downward projecting lips is offset from said first sealing section plurality of upper projecting lips, when said top and bottom joinable sections are joined; and
wherein said first sealing section plurality of upward projecting lips and said second sealing section plurality of offset downward projecting lips include a space therebetween, said space forming a channel therein.

13. A sealing assembly for mating an electrical device enclosure, as in claim 12, wherein said plurality of offset downward projecting lips of said second sealing section engage said plurality of channels of said first sealing section, and said plurality of upward projecting lips of said first sealing section engage said plurality of channels of said second sealing section when said top and bottom joinable sections are joined.

14. A sealing assembly for mating an electrical device enclosure, as in claim 13, wherein at least one of said plurality of channels of said first or second sealing sections contain the stubbed gasket therein.

15. A sealing assembly for mating an electrical device enclosure, as in claim 14, wherein said stubbed gasket is sized to compress when said top and bottom joinable sections are joined.

* * * * *